(12) United States Patent
Ato et al.

(10) Patent No.: US 7,994,542 B2
(45) Date of Patent: Aug. 9, 2011

(54) SEMICONDUCTOR DEVICE

(75) Inventors: Hirokazu Ato, Tokyo (JP); Kazuhiko Matsuki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 704 days.

(21) Appl. No.: 11/806,451

(22) Filed: May 31, 2007

(65) Prior Publication Data

US 2007/0278528 A1    Dec. 6, 2007

(30) Foreign Application Priority Data

Jun. 1, 2006  (JP) ................................. 2006-153690

(51) Int. Cl.
*H01L 27/10*    (2006.01)
(52) U.S. Cl. .......... 257/207; 257/27; 257/565; 257/544
(58) Field of Classification Search .................... 257/27; 327/565, 544; 361/631
See application file for complete search history.

(56) References Cited

U.S. PATENT DOCUMENTS

| | | | |
|---|---|---|---|
| 6,305,000 B1* | 10/2001 | Phan et al. | 716/120 |
| 6,635,934 B2* | 10/2003 | Hidaka | 257/369 |
| 7,200,831 B2 | 4/2007 | Kitabayashi | |
| 7,525,132 B2* | 4/2009 | Kitabayashi et al. | 257/211 |
| 7,557,639 B2* | 7/2009 | Onda | 327/534 |
| 2001/0022748 A1* | 9/2001 | Shimizu et al. | 365/200 |
| 2007/0120260 A1 | 5/2007 | Kitabayashi et al. | |
| 2007/0241810 A1* | 10/2007 | Onda | 327/544 |
| 2007/0278528 A1* | 12/2007 | Ato et al. | 257/207 |

FOREIGN PATENT DOCUMENTS

| | | |
|---|---|---|
| JP | 11-31385 | 2/1999 |
| JP | 2005-135971 | 5/2005 |

OTHER PUBLICATIONS

Japanese Office Action dated Apr. 22, 2008.
Japanese Office Action dated Dec. 4, 2008 with English-Language Translation.
Japanese Office Action dated Mar. 24, 2009 with English-Language Translation.

* cited by examiner

*Primary Examiner* — Ken A Parker
*Assistant Examiner* — David Spalla
(74) *Attorney, Agent, or Firm* — McGinn IP Law Group, PLLC

(57) ABSTRACT

A semiconductor device of the present invention comprises a logic circuit to which a power supply voltage, a sub-power supply voltage, a ground voltage and a sub-ground voltage are supplied; a driver for generating the sub-power supply voltage and the sub-ground voltage based on the power supply voltage and the ground voltage; a first wiring layer including a sub-power supply line for supplying the sub-power supply voltage and a sub-ground line for supplying the sub-ground voltage; a second wiring layer including source/drain lines for MOS transistors; a third wiring layer including a main power supply line for supplying the power supply voltage and a main ground line for supplying the ground voltage and arranged opposite to the first wiring layer to sandwich the second wiring layer; via structures for connecting the source/drain lines of the second wiring layer to the other layers.

7 Claims, 17 Drawing Sheets

SEMICONDUCTOR DEVICE

BACKGROUND OF THE INVENTION

1. Field of the Invention

The present invention relates to a semiconductor device including a logic circuit configured by MOS transistors, and particularly relates to a semiconductor device including an inverter circuit driven by two-way power supply wiring system in a semiconductor memory device such as a DRAM (Dynamic Random Access Memory).

2. Description of the Related Art

In recent years, semiconductor memory devices such as DRAMs have been often installed in mobile devices, and it becomes an important issue to reduce consumption current in standby operation. For the purpose of such a reduction in consumption current, a circuit configuration capable of suppressing sub-threshold current of MOS transistors using power supply wiring for supplying a sub-power supply voltage and a sub-ground voltage in addition to power supply wiring for supplying a power supply voltage and a ground voltage. By employing such a circuit configuration in a multi-stage inverter circuit or the like in DRAM, the reduction in consumption current can be expected in standby operation (for example, see Japanese Laid-Open Patent Publication H11-31385).

For example, a case in which four-stage inverter circuits as shown in FIGS. 16A and 16B are configured in a semiconductor device will be described. Here, two types of configuration having different connections to power supply wiring are assumed, and respective four-stage inverter circuits to which a power supply line voltage VCC, a ground voltage VSS, a sub-power supply voltage VCT and a sub-ground voltage VST are supplied are shown. First, FIG. 16A shows a configuration of the inverter circuit in which an output signal OUT is high in standby operation. In this configuration, the sub-power supply voltage VCT and the ground voltage VSS are supplied to odd number stage inverters, and the power supply voltage VCC and the sub-ground voltage VST are supplied to even number stage inverters. Meanwhile, FIG. 16B shows a configuration of the inverter circuit in which the output signal OUT is low in standby operation. In this configuration, the power supply voltage VCC and the sub-ground voltage VST are supplied to odd number inverters, and the sub-power supply voltage VCT and the ground voltage VSS are supplied to even number stage inverters, so that the connections of the power supply wiring is reverse to those in FIG. 16A.

A circuit configuration to realize the above-described inverter circuit is shown, for example, in FIG. 1 (A detailed description of FIG. 1 will be described later.) corresponding to FIG. 16B. Respective inverters forming an inverter unit 1 of FIG. 1 includes a pair of a PMOS transistor and an NMOS transistor. Drivers 2 and 3 are controlled by control voltages Vgp and Vgn, the power supply voltage VCC and the ground voltage VSS are supplied to a MOS transistor being on, and the sub-power supply voltage VCT and the sub-ground voltage VST are supplied to a MOS transistor being off. Thereby, it is possible to suppress unnecessary sub-threshold current.

FIG. 17 shows a general layout corresponding to the circuit configuration of FIG. 1. The layout of FIG. 17 includes diffusion layers 101 to 107 in which PMOS transistors P1 to P7 are respectively formed, diffusion layers 111 to 117 in which NMOS transistors N1 to N7 are respectively formed. Further, a gate wiring layer 121 connected to each gate electrode of the MOS transistors, a source/drain wiring layer 122 in which wiring for each source/drain of the MOS transistors is formed, and a wiring layer 123 in which various kinds of wiring for the power supply or for controlling are formed are stacked. The wiring layer 123 includes a main power supply line L1 for supplying the power supply voltage VCC, a sub-power supply line L3 for supplying the sub-power supply voltage VCT, a main ground line L2 for supplying the ground voltage VSS, and a sub-ground line L4 for supplying the sub-ground voltage VST. Further, the source/drain wiring layer 122 and the wiring layer 123 are connected by vias 124 in a stacking direction. In this manner, by changing positions of the vias 124 in the manufacturing process for respective lines extending in parallel in the wiring layer 123 at both sides of the diffusion layers 101 to 107 and 111 to 117, each MOS transistor is connected to a desired line so as to realize the circuit configuration of FIG. 1.

However, in the wiring layer 123 in the layout of FIG. 17, total six lines including the main power supply line L1, the main ground line L2, the sub-power supply line L3, the sub-ground line L4 and driver control lines L5 and L6 are arranged in parallel. In this case, in consideration of positions of the vias 124 and the source/drain wiring layer 122, it is inevitable that respective sets of three lines are arranged on both the P-channel and N-channel sides between which the diffusion layers 101 to 107 and 111 to 117 are disposed, and thereby increasing extra layout area. If only the power supply voltage VCC and the ground voltage VSS are used as the power supply wiring, only two lines including the main power supply line L1 and the main ground line L2 are required. However, the circuit configuration using two-way power supply wiring system is adopted, and thus the extra layout area for arranging four lines in parallel including the sub-power supply line L3, the sub-ground line L4 and the driver control lines L5 and L6 is required. Further, in FIG. 17, a space in which the diffusion layers 101 to 104 and 111 to 114 forming the inverter unit 1 are arranged separately from the diffusion layers 105 to 107 and 115 to 117 forming drivers 2 and 3 is required, and the layout area occupied by the drivers 2 and 3 is not negligible.

In this manner, when employing the configuration capable of reducing consumption current in standby operation, it is a problem that the area for arranging the lines and the like in a layout of the semiconductor device is inevitably increased and the entire chip size is increased.

BRIEF SUMMARY OF THE INVENTION

It is an object of the present invention to provide a semiconductor device in which a configuration using two-way power supply wiring system is adopted for the purpose of a reduction in consumption current when configuring a logic circuit in the semiconductor device, and increase in layout area due to an increase in wiring can be avoided.

An aspect of the present invention is a semiconductor device comprising: a logic circuit to which a power supply voltage and a sub-power supply voltage lower than said power supply voltage are supplied at a power supply side and to which a ground voltage and a sub-ground voltage higher than said ground voltage are supplied at a ground side; a driver for generating said sub-power supply voltage based on said power supply voltage and for generating said sub-ground voltage based on said ground voltage; a first wiring layer including a sub-power supply line for supplying said sub-power supply voltage and a sub-ground line for supplying said sub-ground voltage; a second wiring layer including source/drain lines for PMOS and NMOS transistors included in said logic circuit and said driver; a third wiring layer including a main power supply line for supplying said power supply voltage and a main ground line for supplying said ground voltage and arranged opposite to said first wiring layer in a stacking direction to sandwich said second wiring layer; a first via structure for connecting said source/drain lines of said second wiring layer to said sub-power supply line or said sub-ground line of said second wiring layer in a stacking direction; and a second via structure for connecting said source/drain lines of said second wiring layer to said main power supply line or said main ground line of said third wiring layer in a stacking direction.

According to the semiconductor device of the present invention, in the layout for supplying the sub-power supply voltage and the sub-ground voltage to the logic circuit, which voltages are generated by the driver based on the power supply voltage and the ground voltage, a stacking structure is adopted in which the first wiring layer, the second wiring layer and the third wiring layer are stacked. Respective source/drain lines of a large number of MOS transistors in the logic circuit and the driver are formed in the second wiring layer placed between the first and third wiring layers. These source/drain lines are connected to the sub-power supply line and the sub-ground line in the first wiring layer by the first via structure, and connected to the main power supply line and the main ground line in the third wiring layer by the second via structure. By forming either of the first and second via structures is formed for each of the MOS transistors, it is possible to selectively supply the power supply voltage, the ground voltage, the sub-power supply voltage and the sub-ground voltage. In this case, since the first and third layers are arranged opposite to each other in the stacking direction, respective patterns thereof overlay one another, and the area occupied by the entire power supply wiring can be reduced to half.

In the present invention, said first wiring layer may be placed below said second wiring layer and said third wiring layer may places above said second wiring layer.

In the present invention, in the vicinity of the plurality of PMOS transistors, said sub-power supply line of said first wiring layer may be arranged opposite to said main power supply line of said third wiring layer to sandwich said second wiring layer, and in the vicinity of the plurality of NMOS transistors, said sub-ground line of said first wiring layer may be arranged opposite to said main ground line of said third wiring layer to sandwich said second wiring layer.

In the present invention, in the vicinity of the plurality of PMOS transistors, said sub-power supply line of said first wiring layer may be arranged opposite to said main ground line of said third wiring layer to sandwich said second wiring layer, and in the vicinity of the plurality of NMOS transistors, said sub-ground line of said first wiring layer may be arranged opposite to said main power supply line of said third wiring layer to sandwich said second wiring layer.

In the present invention, in the vicinity of the plurality of PMOS transistors, said sub-ground line of said first wiring layer may be arranged opposite to said main power supply line of said third wiring layer to sandwich said second wiring layer, and in the vicinity of the plurality of NMOS transistors, said sub-power supply line of said first wiring layer may be arranged opposite to said main ground line of said third wiring layer to sandwich said second wiring layer.

In the present invention, said logic circuit may be an inverter circuit in which pairs of a PMOS transistor and an NMOS transistor are connected in a predetermined number of stages.

In the present invention, said driver may have one or more PMOS transistors having sources connected to said main power supply line and drains connected to said sub-power supply line, and may have one or more NMOS transistors having sources connected to said main ground line and drains connected to said sub-ground line.

In the present invention, said driver may have one or more PMOS transistors having sources connected to said main ground line and drains connected to said sub-ground line, and may have one or more NMOS transistors having sources connected to said main power supply line and drains connected to said sub-power supply line.

In the present invention, said driver may have one or more PMOS transistors and one or more NMOS transistors, and operation of each of the PMOS and NMOS transistors may be controlled by a control voltage applied to each gate thereof.

In the present invention, the PMOS transistors included in said inverter circuit and the NMOS transistors included in said driver may be alternately arranged with a predetermined spacing, and the NMOS transistors included in said inverter circuit and the NMOS transistors included in said driver may be alternately arranged with a predetermined spacing.

In the present invention, the PMOS transistors included in said inverter may have sources of odd number stages connected to said main power supply line and sources of even number stages connected to said sub-power supply line, and the NMOS transistors included in said inverter may have sources of odd number stages connected to said sub-ground line and sources of even number stages connected to said main ground line. Such a configuration is suitable for the inverter circuit which is controlled such that an output signal from an even number stage is low in standby operation.

In the present invention, the PMOS transistors included in said inverter may have sources of odd number stages connected to said sub-power supply line and sources of even number stages connected to said main power supply line, and the NMOS transistors included in said inverter may have sources of odd number stages connected to said main ground line and sources of even number stages connected to said sub-ground line. Such a configuration is suitable for the inverter circuit which is controlled such that an output signal from an even number stage is high in standby operation.

As described above, according to the present invention, when a configuration using two-way power supply wiring system is adopted in a semiconductor device for the purpose of reducing consumption current, source/drain lines of MOS transistors required for operation of a logic circuit are formed in a center layer of a three layer structure, and can be connected to the upper and lower lines selectively by via structures. Accordingly, even when the two-way power supply wiring system is used, a layout area substantially close to that using one-way power supply wiring system is required, and it is possible to realize a semiconductor device adopting a configuration for reducing consumption current with a small chip size. Further, since positions of the via structures can be easily changed in the manufacturing process, the circuit configuration or the power supply wiring connections can be properly changed based on a basic layout.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

With reference to the accompanying drawings, preferred embodiments of the present invention will be described below. In the following description, it is assumed that the present invention is applied to a semiconductor device such as DRAM having an inverter circuit, and four embodiments are described of which respective inverter circuits are different in circuit configuration and layout.

First Embodiment

Figure 1:
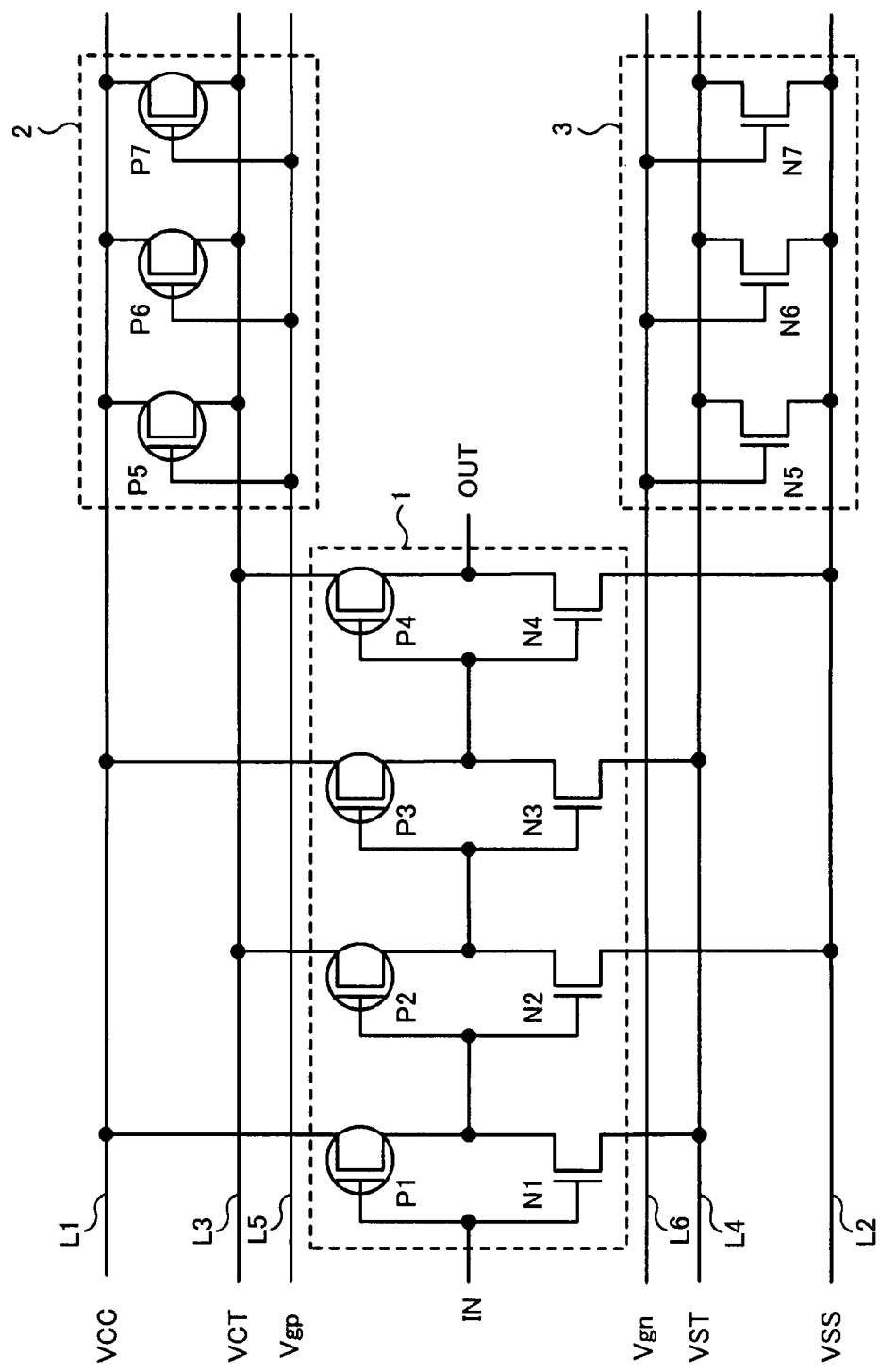
FIG. 1 is a view showing a circuit configuration of an inverter circuit of a first embodiment.

The first embodiment deals with an example of an inverter circuit adopting the standby current reduction method, in which an output signal OUT is low in standby operation. FIG. 1 illustrates a circuit configuration of the inverter circuit of the first embodiment, in which the entire inverter circuit is configured of a plurality of MOS transistors forming a four-stage inverter unit 1, a P-channel side driver 2 and an N-channel side driver 3.

In FIG. 1, the inverter unit 1, which receives an input signal IN and outputs the output signal OUT, includes four PMOS transistors P1, P2, P3 and P4 and four NMOS transistors N1, N2, N3 and N4. The P-channel side driver 2 includes three PMOS transistors P5, P6 and P7 while the N-channel side transistor 3 includes three NMOS transistors N5, N6 and N7. Besides, in FIG. 1, there are provided a main power supply line L1 for supplying a power supply voltage VCC, a main ground line L2 for supplying a ground voltage VSS, a sub-power supply line L3 for supplying a sub-power supply voltage VCT that is lower than the power supply voltage VCC and a sub-ground line L4 for supplying a sub-ground voltage VST that is higher than the ground voltage VSS.

In this configuration, a PMOS transistor P1 and an NMOS transistor N1 are in a pair to form a first-stage inverter. An input signal IN is applied to commonly connected gates of the PMOS transistor P1 and the NMOS transistor N1, and a signal from commonly connected drains thereof is sent to a second-stage inverter. Besides, a PMOS transistor P2 and an NMOS transistor N2 are in a pair to form the second-stage inverter, which is connected in the same manner as the first-stage inverter. Further, a PMOS transistor P3 and an NMOS transistor N3 are in a pair to form a third-stage inverter, and a PMOS transistor P4 and an NMOS transistor N4 are in a pair to form a fourth-stage inverter, which are also connected in the same manner. In FIG. 1, the output signal OUT output from the fourth-stage inverter has the same polarity as that of the input signal IN and is low in standby operation.

In the standby current reduction method adopted in the first embodiment, among eight MOS transistors of the four-stage inverter unit 1, some transistors which are on in standby operation are supplied with the power supply voltage VCC and the ground voltage VSS, while the others which are off in standby operation are supplied with the sub-power supply voltage VCT and the sub-ground voltage VST. Thus, connections of the respective-stage inverters to the lines are alternately provided, and specifically, in the first-stage and third-stage inverters, respective sources of the PMOS transistors P1 and P3 which are on are connected to the main power supply line L1 and respective sources of the NMOS transistors N1 and N3 which are off are connected to the sub-ground line L4. In the second-stage and fourth-stage inverters, respective sources of the PMOS transistors P2 and P4 which are off are connected to the sub-power supply line L3 and respective sources of the NMOS transistors N2 and N4 which are on are connected to the main grand line L2.

Meanwhile, the PMOS transistors P5, P6 and P7 forming the P-channel side driver 2 have sources commonly connected to the main power supply line L1, and drains commonly connected to the sub-power supply line L3. This driver 2 utilizes the power supply voltage VCC as a basis to generate the sub-power supply voltage VCT which is lower than the power supply voltage VCC on the sub-power supply line L3. Respective gates of the PMOS transistors P5, P6 and P7 are supplied with a control voltage Vgp via a P-channel side driver control line L5. The P-channel side driver 2 can be operated by controlling the control voltage Vgp to be low, while the P-channel side driver 2 can be stopped to operate by controlling the control voltage Vgp to be high. Here, in normal operation, the drivers 2 and 3 are controlled to operate, however in standby operation, the drivers 2 and 3 are controlled to be stopped to operate.

The NMOS transistors N5, N6 and N7 forming the N-channel side driver 3 have sources commonly connected to the main ground line L2, and drains commonly connected to the sub-ground line L4. This driver 3 can utilize the ground voltage VSS as a basis to generate the sub-ground voltage VST which is higher than the ground voltage VSS on the sub-ground line L4. Respective gates of the NMOS transistors N5, N6 and N7 are supplied with a control voltage Vgn via an N-channel side driver control line L6. The N-channel side driver 3 can be operated by controlling the control voltage Vgn to be high, while the N-channel side driver 3 can be stopped to operate by controlling the control voltage Vgn to be low.

Figure 2:
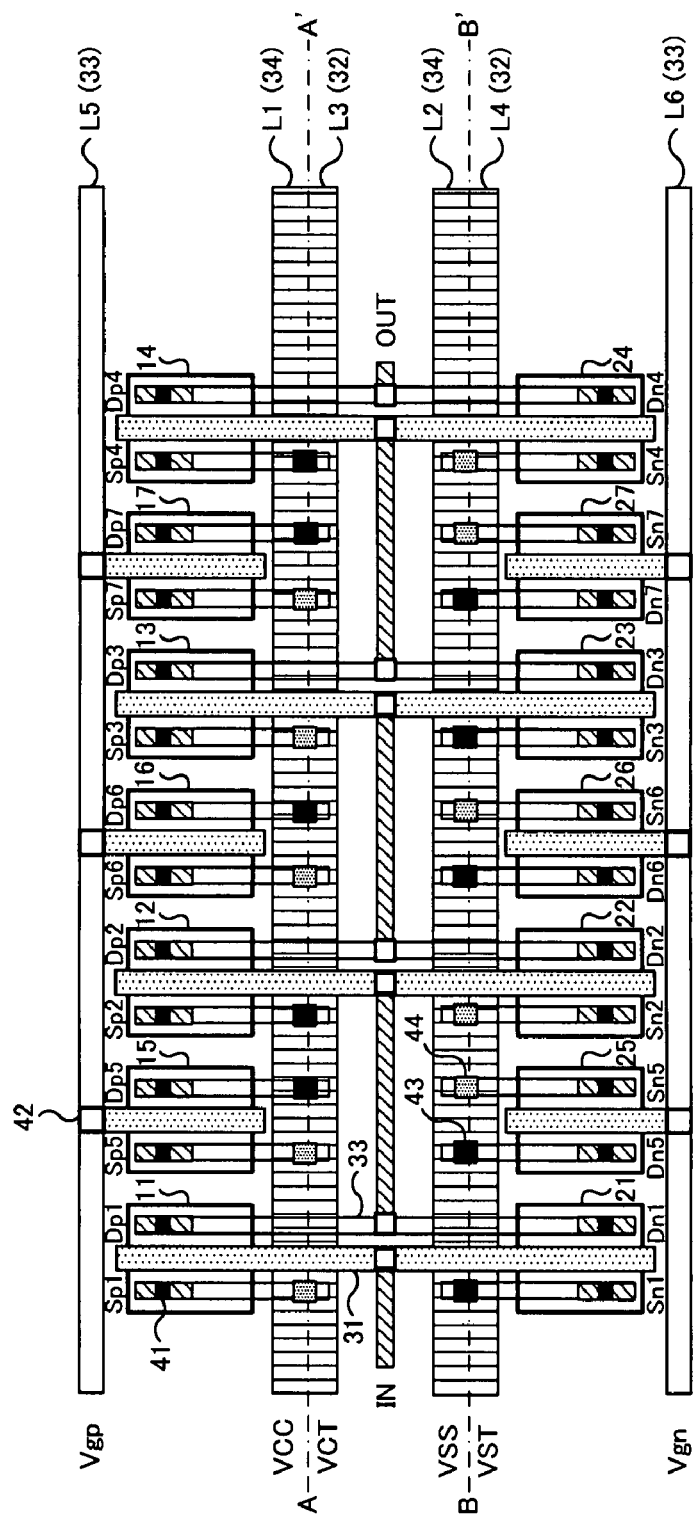
FIG. 2 is a view showing a layout corresponding to the circuit configuration of FIG. 1.

Next description is made, with reference to FIG. 2, about a layout corresponding to the circuit configuration in FIG. 1. In the layout illustrated in FIG. 2 there are arranged P-channel side diffusion layers 11 to 17 formed on a semiconductor substrate corresponding to seven PMOS transistors P1 to P7 and N-channel side diffusion layers 21 to 27 formed on the semiconductor substrate corresponding to seven NMOS transistors N1 to N7.

There are also stacked in the layout illustrated in FIG. 2, gate wiring layer 31 connected to the gate electrodes of the respective MOS transistors, first wiring layer 32 including the sub-power supply line L3 and the sub-ground line L4, second wiring layer 33 including source/drain lines of the respective MOS transistors and a third wiring layer 34 including the main power supply line L1 and the main ground line L2. Generally, polysilicon wiring is used in the gate wiring layer 31 and metal wiring is used in the first to third wiring layers 32 to 34.

Further, there are also provided in the layout of FIG. 2, connecting portions 41, 42, 43 and 44. Connecting portions 41 are formed to connect source/drain regions of the diffusion layers 11 to 17 and 21 to 27 to the second wiring layer 33 and include lower contacts and upper vias connected to sandwich the first wiring layer 32. Connecting portions 42 are formed to connect the gate wiring layer 31 to the second wiring layer 33 and include lower contacts and upper vias connected to sandwich the first wiring layer 32. Connecting portions 43 are vias formed to connect the first wiring layer 32 to the second wiring layer 33. Connecting portions 44 are vias formed to connect the second wiring layer 33 and the third wiring layer 34.

The P-channel side diffusion layers 11 to 17 are arranged spaced from each other by a given distance in the order of the diffusion layer 11 corresponding to the PMOS transistor P1, the diffusion layer 15 corresponding to the PMOS transistor P5, the diffusion layer 12 corresponding to the PMOS transistor P2, the diffusion layer 16 corresponding to the PMOS transistor P6, the diffusion layer 13 corresponding to the PMOS transistor P3, the diffusion layer 17 corresponding to the PMOS transistor P7 and the diffusion layer 14 corresponding to the PMOS transistor P4 from the left side of FIG. 2. That is, four PMOS transistors P1 to P4 of the inverter unit 1 and three PMOS transistors P5 to P7 of the driver 2 are arranged alternately.

The N-channel side diffusion layers 21 to 27 are arranged spaced from each other by a given distance in the order of the diffusion layer 21 corresponding to the NMOS transistor N1, the diffusion layer 25 corresponding to the NMOS transistor N5, the diffusion layer 22 corresponding to the NMOS transistor N2, the diffusion layer 26 corresponding to the NMOS transistor N6, the diffusion layer 23 corresponding to the NMOS transistor N3, the diffusion layer 27 corresponding to the NMOS transistor N7 and the diffusion layer 24 corresponding to the NMOS transistor N4 from the left side of FIG. 2. In this case, four NMOS transistors N1 to N4 of the inverter unit 1 and three NMOS transistors N5 to N7 of the driver 3 are arranged alternately, which is a common point with the P-channel side.

As is illustrated in FIG. 2, the diffusion layers 11 to 17 corresponding to the seven PMOS transistors P1 to P7 and the diffusion layers 21 to 27 corresponding to the seven NMOS transistors N1 to N7 are arranged opposite to each other with a predetermined spacing. Then, the PMOS transistor P1 and the NMOS transistor N1, the PMOS transistor P2 and the NMOS transistor N2, the PMOS transistor P3 and the NMOS transistor N3, and the PMOS transistor P4 and the NMOS transistor N4, which are paired respectively in FIG. 1, are arranged to have the respective gate electrodes connected via the gate wiring layer 31 and the respective drains connected via the second wiring layer 33.

Figure 3A:
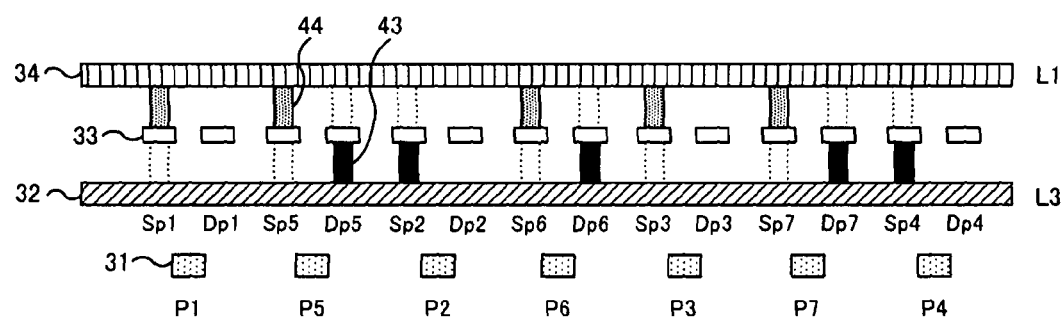
FIGS. 3A and 3B are cross-sectional structural views corresponding to the layout of FIG. 2.
Figure 3B:
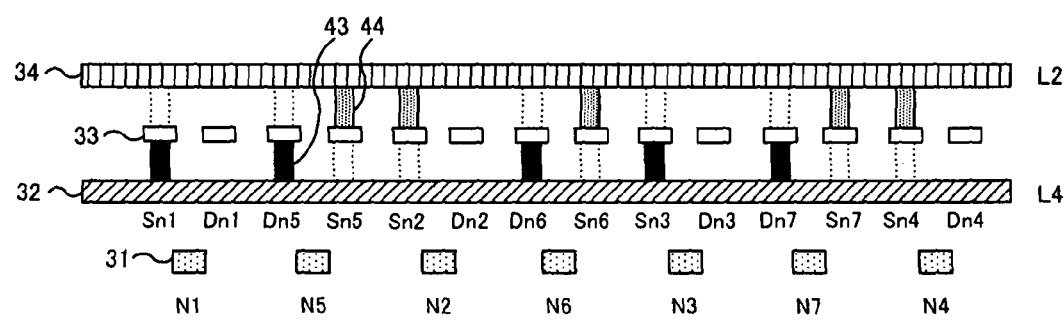

Here, in order to explain connections of the sources of the MOS transistors to the lines in FIG. 2, cross-sectional structures corresponding to the layout of FIG. 2 are illustrated in FIGS. 3A and 3B. FIG. 3A is a cross-sectional structural view taken along the line A-A' in FIG. 2, illustrating the positional relationship of the gate wiring layer 31, the first wiring layer 32, the connecting portions 43, the second wiring layer 33, the connecting portions 44 and the third wiring layer 34 which are arranged upward in this order. The gate wiring layer 31 as the lower layer is formed at the respective positions corresponding to the seven PMOS transistors P1 to P7. Here, the gate width and the gate length of each of the PMOS transistors P1 to P7 are determined in accordance with the line width of the gate electrode and the size of a corresponding one of the diffusion layers 11 to 17.

The sub-power supply line L3 is formed in the first wiring layer 32 and, at the opposite side of the second wiring layer 33, the main power supply line L1 is formed in the third wiring layer 34. As is seen from FIGS. 2 and 3A, the main power supply line L1 and the sub-power supply line L3 are identical in shape and arranged at a position where their patterns face and overlay one another in the stacking direction. Formed in the second wiring layer 33 between the first wiring layer 32 and the third wiring layer 34 are source lines Sp1 to Sp4 and drain lines Dp1 to Dp4 of the four PMOS transistors P1 to P4 of the inverter unit 1 and source lines Sp5 to Sp7 and drain lines Dp5 to Dp7 of the three PMOS transistors P5 to P7 of the driver 2.

First, the source lines Sp1 and Sp3 of the PMOS transistors P1 and P3 of the first-stage and third-stage inverters and the source lines Sp5 to Sp7 of the PMOS transistors P5 to P7 of the driver 2 are connected to the main power supply line L1 of the upper third wiring layer 34 via the connecting portions 44. Besides, the source lines Sp2 and Sp4 of the PMOS transistors P2 and P4 of the second-stage and fourth-stage inverters and the drain lines Dp5 to Dp7 of the PMOS transistors P5 to P7 of the driver 2 are connected to the sub-power supply line L3 of the lower first wiring layer 32 via the connecting portions 43.

On the other hand, FIG. 3B is a cross-sectional structural view taken along the line B-B' in FIG. 2, in which the fundamental structure of the seven NMOS transistors N1 to N7 is similar to that of FIG. 3A. The structure of FIG. 3B and that of FIG. 3A are symmetrical, and in FIG. 3B the sub-ground line L4 is formed in the lower first wiring layer 32 and, at the opposite side of the second wiring layer 33, the main ground line L2 is formed in the upper third wiring layer 34. Besides, the positional relationship of the connecting portions 43 and 44 for connecting source lines Sn1 to Sn7 or drain lines Dn1 to Dn7 in the second wiring layer 33 to the first wiring layer 32 or the third wiring layer 34 is determined to correspond to the circuit configuration of FIG. 1 and the inverter unit 1 of FIG. 3B is vertically reverse to that of FIG. 3A.

Formed in the second wiring layer 33 are the P-channel side driver control line L5 and the N-channel side driver control line L6. The P-channel side driver control line L5 is arranged at the opposite side of the diffusion layer 11 to 17 to the main power supply line L1 and the sub-power supply line L3. Likewise, the N-channel side driver control line L6 is arranged at the opposite side of the diffusion layer 21 to 27 to the main ground line L2 and the sub-ground line L4. The P-channel side driver control line L5 and the N-channel side driver control line L6 are connected via the connecting portions 42 to positions of the gate wiring layer 31 that correspond to the PMOS transistors P5 to P7 and the NMOS transistors N5 to N7 of the drivers 2 and 3.

As is seen from FIGS. 2, 3A and 3B, a structural feature of the first embodiment is that the main power supply line L1 and the sub-power supply line L3 are arranged to overlay one another in the stacking direction and the main ground line L2 and the sub-ground line L4 are arranged to overlay one another in the stacking direction so as to connect the lines to the inverter unit 1. With this arrangement, the layout of FIG. 2 needs space only for two lines to be left for wiring, and on the other hand, the layout of FIG. 17 needs space for four lines to be left for wiring. Namely, the layout of FIG. 2 can be reduced in area by about two lines of space as compared with the layout of FIG. 17.

Another structural feature of the first embodiment is that the MOS transistors forming the inverter unit 1 and the MOS transistors forming the drivers 2 and 3 are aligned alternately. With this, power supplying to the MOS transistors of the inverter unit 1 is performed by the respective MOS transistors of the drivers 2 and 3 and thereby wiring paths of the lines can be sufficiently shortened. In this case, even if the first wiring layer 32 where the sub-power supply line L3 and the sub-ground line L4 are formed is made of tungsten with slightly higher resistance, it is possible to reduce the effect of increase in resistance components in supplying power.

Here, if an inverter circuit in which the number of stages is larger is configured, it is only necessary to increase the number of MOS transistors in the circuit configuration of FIG. 2 and increase the number of diffusion layers 11 to 17 and 24 to 27 in the lateral direction of the corresponding layouts in FIGS. 3A and 3B. Besides, as far as the MOS transistors of the drivers 2 and 3 are arranged in the vicinity of the corresponding MOS transistors of the inverter circuit, they are not necessarily arranged alternately.

Second Embodiment

Figure 4:
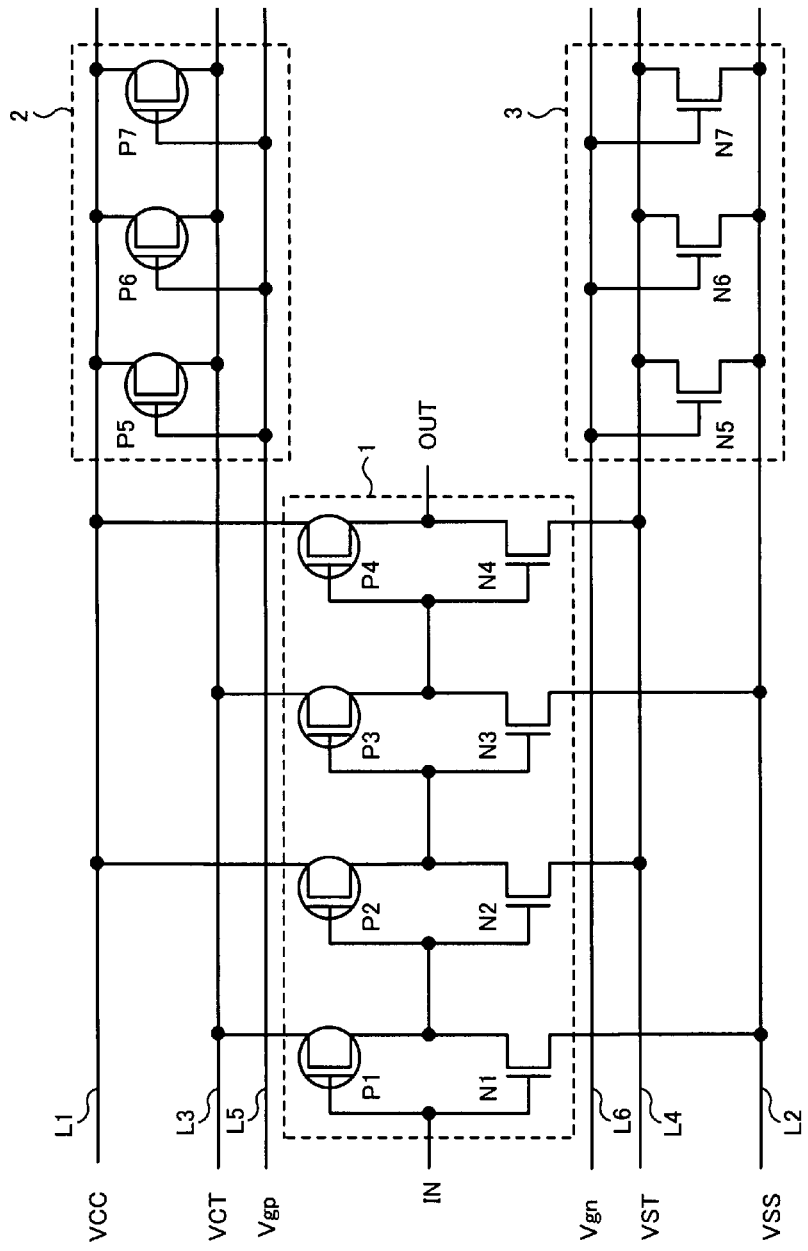
FIG. 4 is a view showing a circuit configuration of an inverter circuit of a second embodiment.

Next, the second embodiment deals with another example of a multi-stage inverter circuit adopting the standby current reduction method, in which the output signal OUT is high in standby operation. FIG. 4 is a view illustrating a circuit configuration of the inverter circuit of the second embodiment, and explanation is omitted about a common configuration with the inverter circuit of the first embodiment in FIG. 1.

In the second embodiment, as illustrated in FIG. 4, connections of the lines to the inverter circuit are reverse to those in FIG. 1. Specifically, in the first-stage and third-stage inverters, respective sources of the PMOS transistors P1 and P3 which are off are connected to the sub-power supply line L3 and respective sources of the NMOS transistors N1 and N3 which are on are connected to the main ground line L2. In the second-stage and fourth-stage inverters, respective sources of the PMOS transistors P2 and P4 which are on are connected to the main power supply line L1 and respective sources of the NMOS transistors N2 and N4 which are off are connected to the sub-ground line L4. Meanwhile, drivers 2 and 3 have the same configuration as that in FIG. 1

Figure 5:
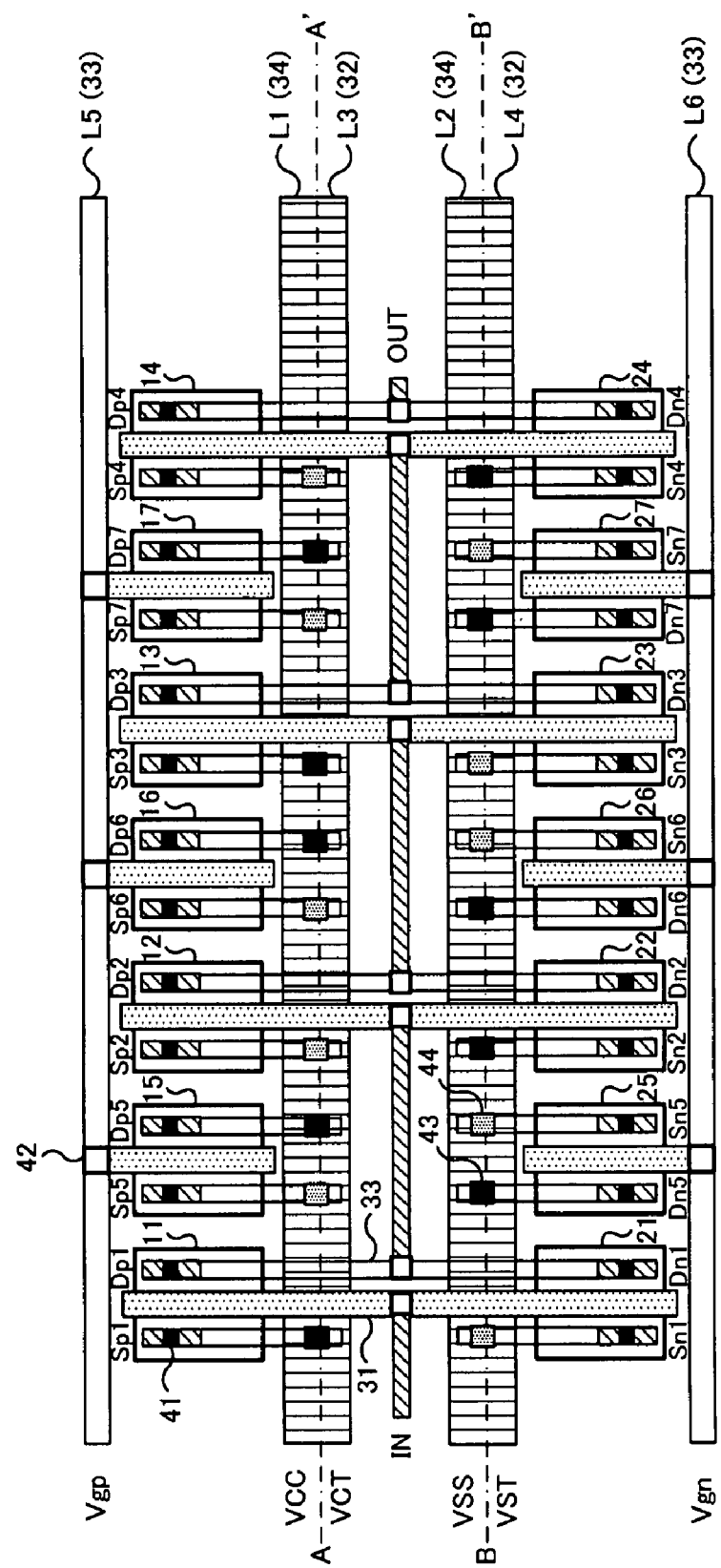
FIG. 5 is a view showing a layout corresponding to the circuit configuration of FIG. 4.
Figure 6A:
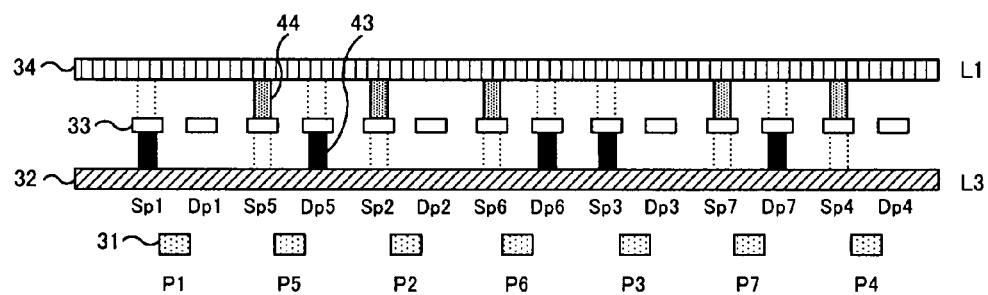
FIGS. 6A and 6B are cross-sectional structural views corresponding to the layout of FIG. 5.
Figure 6B:
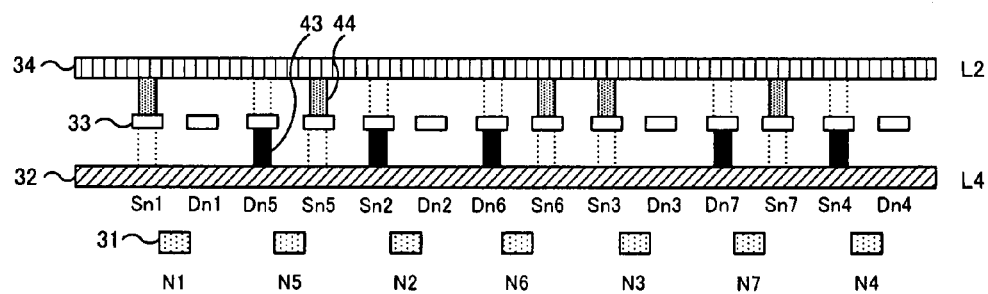

FIG. 5 illustrates a layout corresponding to the circuit configuration of FIG. 4. FIGS. 6A and 6B are cross-sectional structural views corresponding to the layout of FIG. 5. FIG. 6A illustrates a cross section taken along the line A-A' of FIG. 5 and FIG. 6B illustrates a cross section taken along the line B-B' of FIG. 5. The layout of the second embodiment is almost the same as that of the first embodiment, however is different in the connection directions to the lines via the second wiring layer 33.

In other words, as illustrated in FIG. 6A, source lines Sp1 and Sp3 of the PMOS transistors P1 and P3 of the first-stage and third-stage inverters, respectively, are connected to the sub-power supply line L3 of the lower first wiring layer 32 via the connecting portions 43. Besides, source lines Sp2 and Sp4 of the PMOS transistors P2 and P4 of the second-stage and fourth-stage inverters, respectively, are connected to the main power supply line L1 of the upper third wiring layer 34 via the connecting portions 44. Thus, as compared with FIG. 3A, the connection directions of the inverter unit 1 via the connecting portions 43 and 44 in FIG. 6A are vertically reverse to those of FIG. 3A. However, the connection directions of the drivers 2 and 3 via the connecting portions 43 and 44 in FIG. 6A are the same as those in FIG. 3A. The same goes for connection directions of the inverter unit 1 illustrated in FIG. 6B, which are vertically reverse to those of FIG. 3B.

In this way, the structural features of the second embodiment are the same as those of the first embodiment only except for the connection relationship. In this case, the configuration of the first embodiment can be changed into that of the second embodiment, and vice versa, only by changing positions of the connecting portions 43 and 44 in the manufacturing process. Hence, when the polarity of the output signal OUT in standby operation is changed, a simple change in process is required without change in the cell configuration.

Third Embodiment

Figure 7:
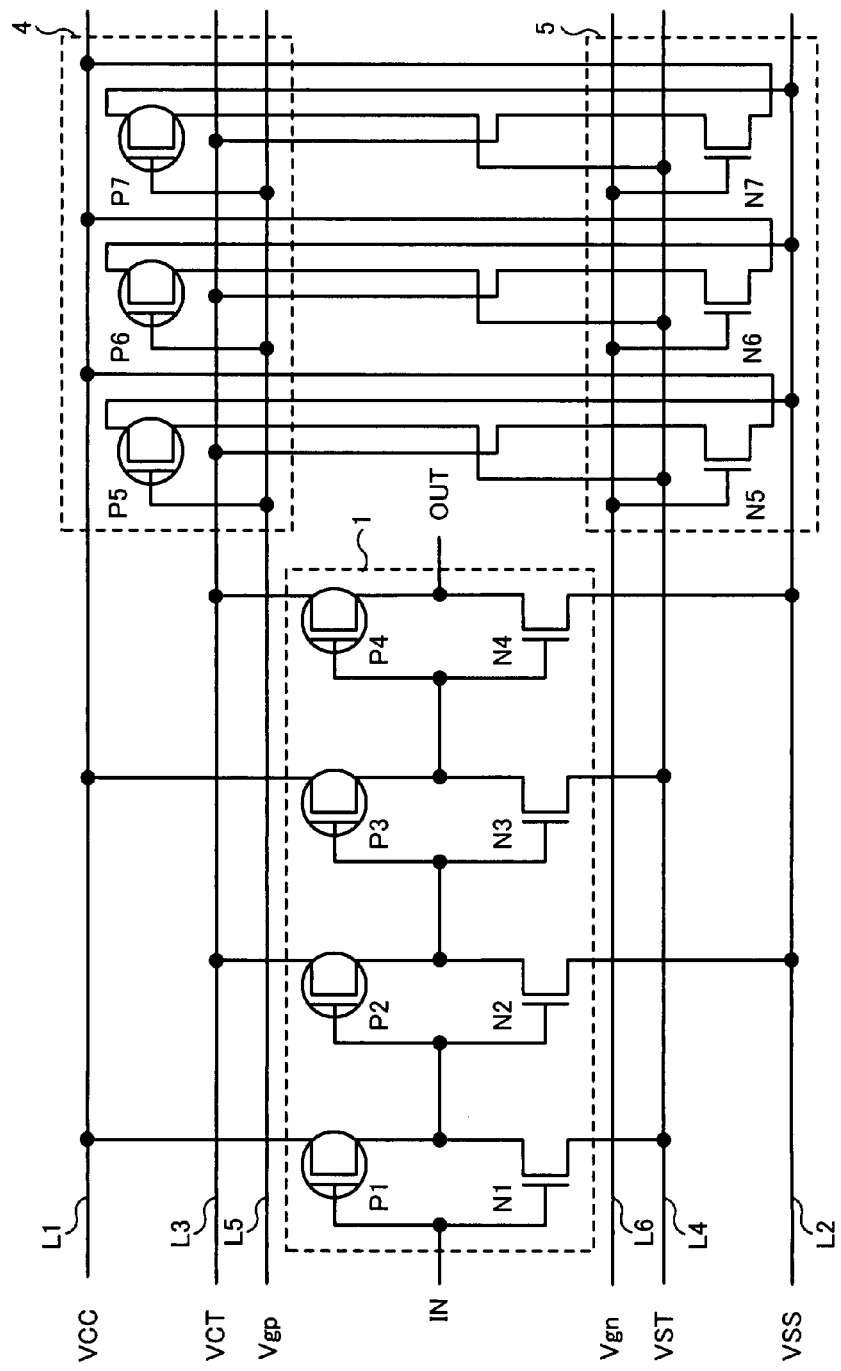
FIG. 7 is a view showing a circuit configuration of an inverter circuit of a third embodiment.

Next, the third embodiment deals with an example of a multi-stage inverter circuit also adopting the standby current reduction method as in the first and second embodiments, which inverter circuit has drivers having connections different from those of the drivers 2 and 3 in the first and second embodiments in order to further improve the current reduction effect in standby operation. FIG. 7 is a view illustrating a circuit configuration of the inverter circuit of the third embodiment, in which, like in the first embodiment, the output signal OUT is low.

As illustrated in FIG. 7, the four-stage inverter unit 1 has the same configuration as that in the first embodiment in FIG. 1 and explanation thereof is omitted. In the third embodiment, PMOS transistors P5 to P7 forming a P-channel side driver 4 have sources commonly connected to the main ground line L2 and drains commonly connected to the sub-ground line L4. Besides, NMOS transistors N5 to N7 forming an N-channel driver 5 have sources commonly connected to the main power supply line L1 and drains commonly connected to the sub-power supply line L3. Here, connections of respective gates of the drivers 4 and 5 are the same as those in FIG. 1.

In FIG. 7, the PMOS transistors P5 to P7 of the P-channel side driver 4 have gates applied with the control voltage Vgp and sources applied with the ground voltage VSS, and the sub-ground voltage VST is generated at drains thereof. Meanwhile, the NMOS transistors N5 to N7 of the N-channel side driver 5 have gates applied with the control voltage Vgn and the sources applied with the power supply voltage VCC, and the sub-power supply voltage VCT is generated at drains thereof. In this case, when the drivers are shut down, the control voltage Vgp rises to the same level as the power supply voltage VCC and the PMOS transistors P5 to P7 are reverse-biased between the gates and sources, and on the other hand, the control voltage Vgn is dropped to the same level as the ground voltage VSS and the NMOS transistors N5 to N7 are reverse-biased between the gates and sources. Accordingly, it becomes possible to further reduce leak current at both of the P-channel side and the N-channel side while the drivers are shut down.

Figure 8:
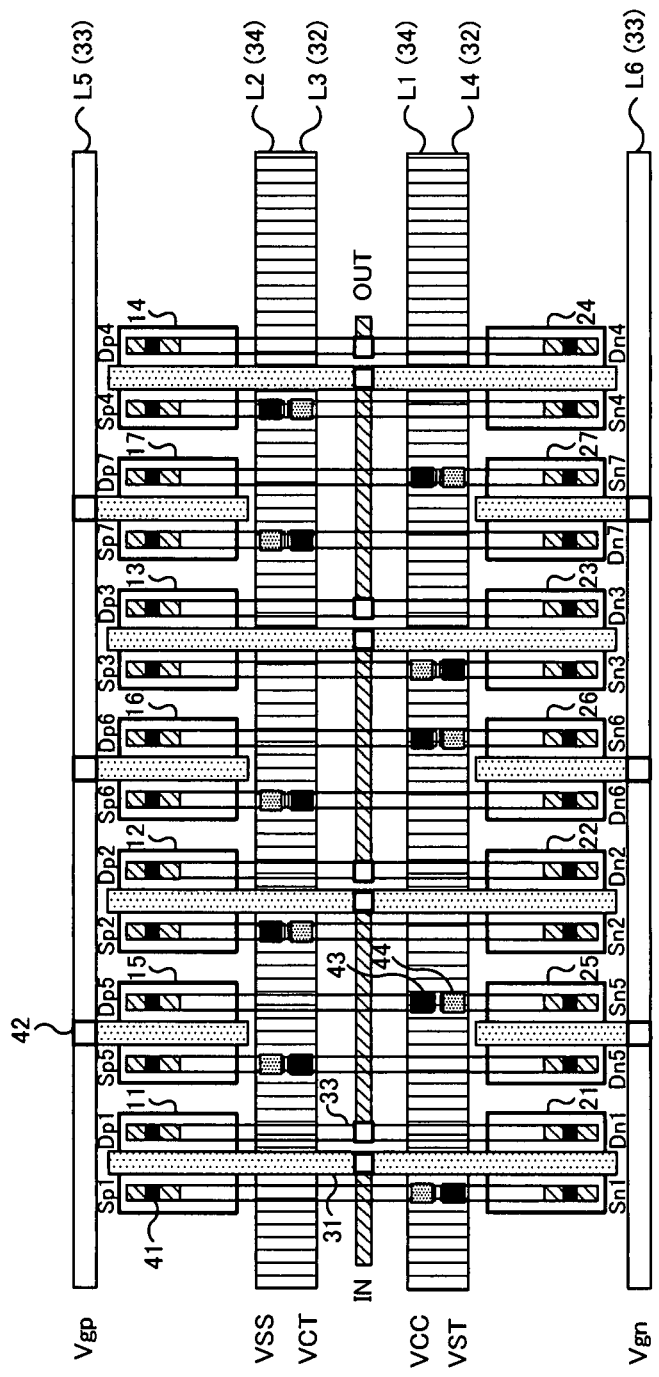
FIG. 8 is a view showing a layout corresponding to the circuit configuration of FIG. 7.

FIG. 8 illustrates a layout corresponding to the circuit configuration of FIG. 7. The layout of the third embodiment is almost the same as the layout of the first or second embodiment, however is different in arrangements of the main power supply line L1 and the main ground line L2 in the third wiring layer 34, and connection directions to the lines via the second wiring layer 33. A cross-sectional structure corresponding to the layout of FIG. 8 is such that connecting portions 43 and 44 having the stacking directions illustrated in FIGS. 3A and 3B are arranged in accordance with each position of cross section.

As illustrated in FIG. 8, at the P-channel side, the sub-power supply line L3 formed in the first wiring layer 32 and the main ground line L2 formed in the third wiring layer 34 are arranged opposite to each other in the stacking direction to sandwich the second wiring layer 33. At the N-channel side, the sub-ground line L4 formed in the first wiring layer 32 and the main power supply line L1 formed in the third wiring layer 34 are arranged opposite to each other in the stacking direction to sandwich the second wiring layer 33. In this way, in FIG. 8, the main power supply line L1 and the main ground line L2 are interchanged as compared with the arrangements of FIGS. 2 and 5.

Meanwhile, in the second wiring layer 33 connected to the inverter unit 1, the connecting portions 44 are formed at positions different from those in FIG. 2 in view of the arrangements of the main power supply line L1 and the main ground line L2. In other words, the source lines Sp1 and Sp3 of the respective PMOS transistors P1 and P3 are extended to below the further main power supply line L1 and connected to the main power supply line L1 via the connecting portions 44. Besides, the source lines Sn2 and Sn4 of the respective NMOS transistors N2 and N4 are extended to below the further main ground line L2 and connected to the main ground line L2 via the connecting portions 44.

In the second wiring layer 33 connected to the drivers 4 and 5, the connecting portions 43 are formed at positions different from those in FIG. 2 in view of the arrangements of the main power supply line L1 and the main ground line L2 and the circuit configuration of FIG. 7. In other words, the drain lines Dp5 to Dp7 of the respective PMOS transistors P5 to P7 are extended to above the further sub-ground line L4 and connected to the sub-ground line L4 via the connecting portions 43. Besides, the drain lines Dn5 to Dn7 of the respective NMOS transistors N5 to N7 are extended to above the further sub-power supply line L3 and connected to the sub-power supply line L3 via the connecting portions 43.

Figure 9:
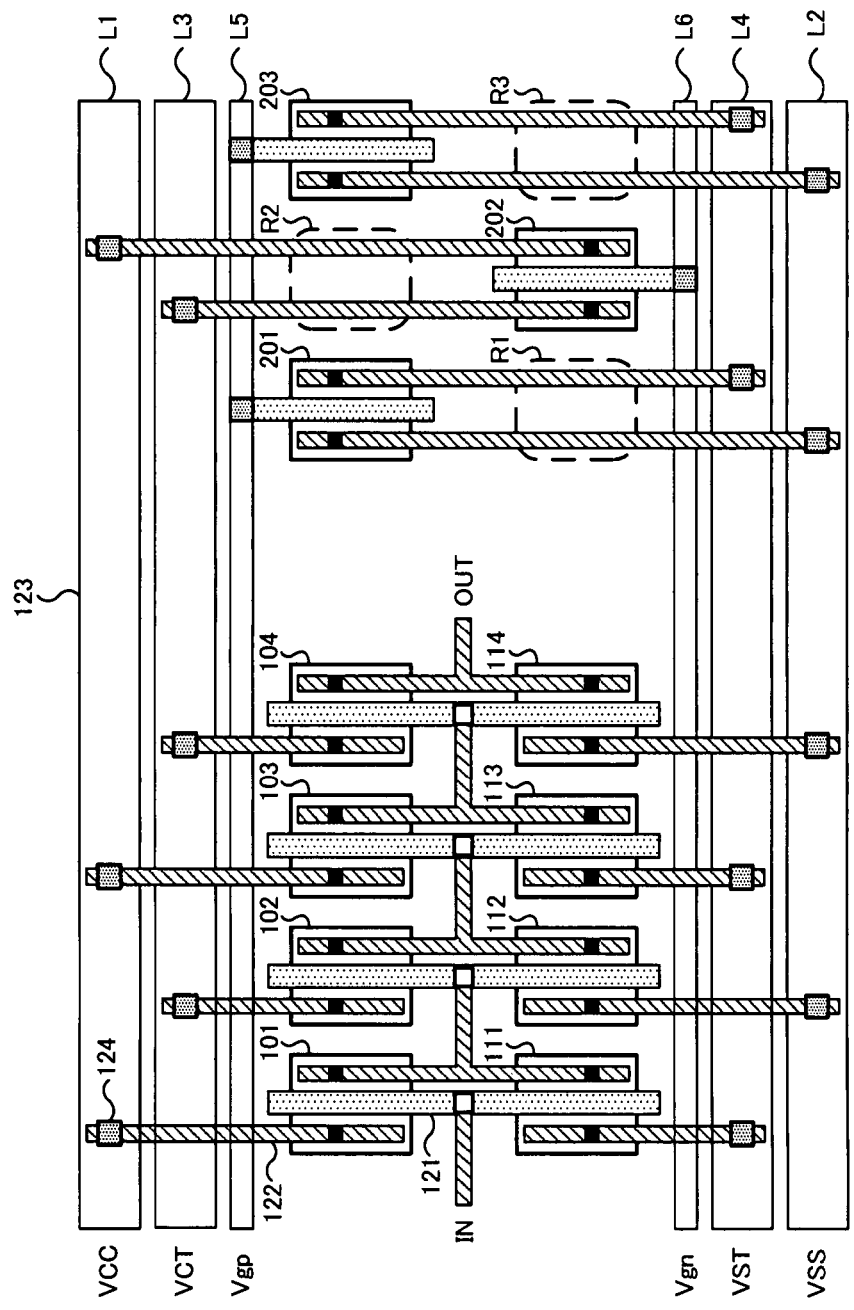
FIG. 9 is a view showing a layout as a comparative example of FIG. 8 which is obtained by applying the circuit configuration to a conventional layout.
Figure 17:
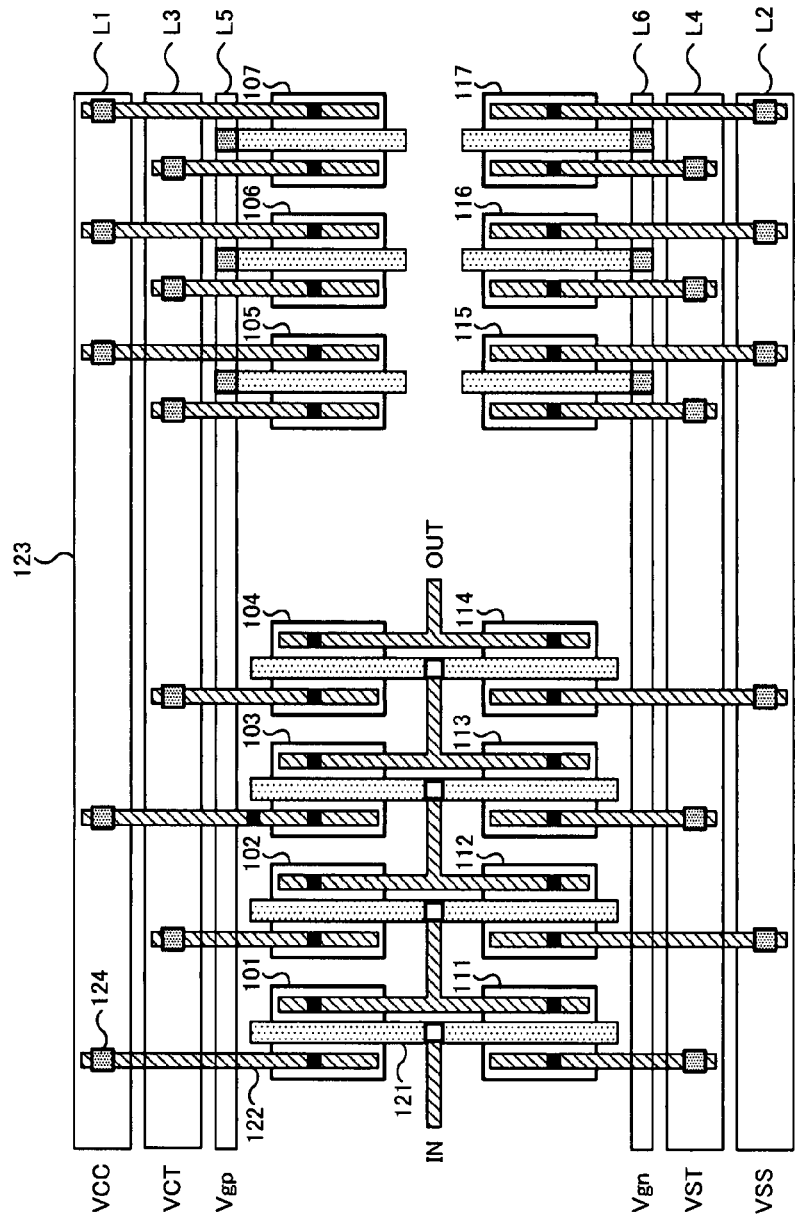
FIG. 17 is a view showing a general layout corresponding to the circuit configuration of FIG. 1.

Here, as a comparative example of FIG. 8, FIG. 9 is referred to explain a problem that occurs when the circuit configuration of FIG. 7 is applied to the conventional layout illustrated in FIG. 17. In the layout of FIG. 9, diffusion layers 101 to 104 and 111 to 114 corresponding to the inverter unit 1 are arranged like in FIG. 17, however three diffusion layers 201, 202 and 203 are only provided corresponding to the drivers 4 and 5. In other words, the diffusion layers 201 to 203 are arranged corresponding to the three diffusion layers 105, 107 and 116 in FIG. 17 and there is no diffusion layer formed in regions R1, R2 and R3 corresponding to the three diffusion layers 106, 115 and 117. For example, as is seen from the diffusion layer 201, connection lines to the main ground line L2 and the sub-ground line L4 are extended to the N-channel side, and there is no space left to arrange opposite diffusion layers. The same goes for the diffusion layers 202 and 203 and therefore, the number of diffusion layers of the drivers 4 and 5 are reduced by half.

Figure 10:
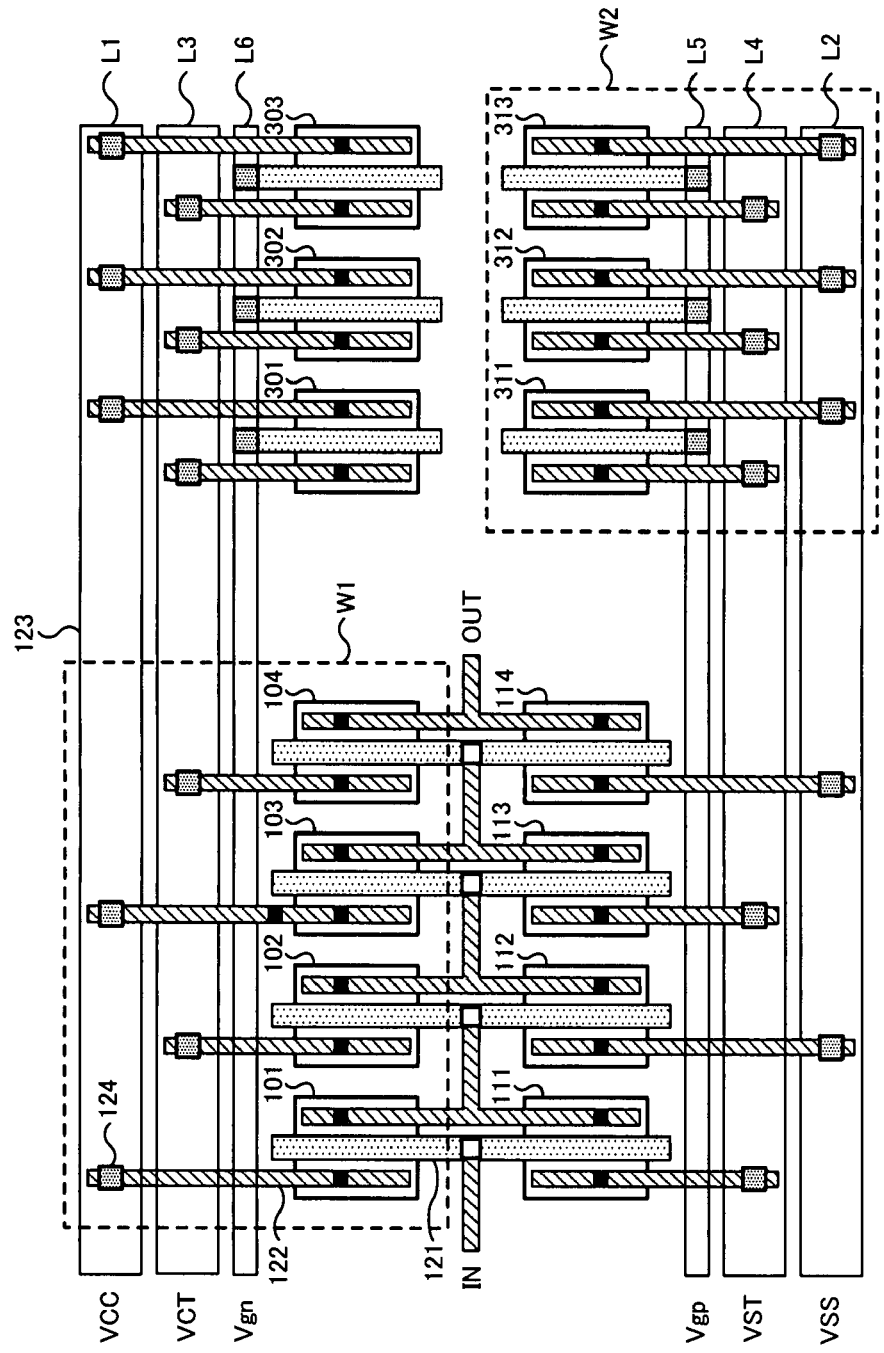
FIG. 10 is a view showing a layout as anther comparative example of FIG. 8 which has an arrangement different from that of FIG. 9.

Meanwhile, as another comparative example of FIG. 8, FIG. 10 illustrates a layout having an arrangement different from that of FIG. 9. In the layout of FIG. 10, diffusion layers 101 to 104 and 111 to 114 corresponding to the inverter unit 1 are arranged in the same manner as those in FIG. 9 and diffusion layers 301, 302 and 303 corresponding to the N-channel side driver 5 and diffusion layers 311, 312 and 313 corresponding to the P-channel side driver 4 are arranged at opposite positions to each other. In this case, as the P-channel side driver 4 and the N-channel side driver 5 are interchanged in position, connection directions to the diffusion layers 301 to 303 and the diffusion layers 311 to 313 are uniform at the respective sides. However, with this arrangement, the diffusion layers 101 and 104 of the inverter unit 1 and the diffusion layers 311 to 313 of the driver 4 are difficult to form in a common N-well and two N-wells W1 and W2 are required to be arranged diagonally. These two N-wells W1 and W2 have to be spaced from each other by such a distance as to satisfy the requirement for the space between N-wells, which brings about reduction of the efficiency of space utilization.

In this way, when the circuit configuration of FIG. 7 is adopted, the layout as illustrated in FIG. 8 is used, thereby to make it possible to make selective connections to the first wiring layer 32 and the third wiring layer 34 that are opposed in the stacking direction, and consequently to avoid the problems shown with FIGS. 9 and 10 from occurring. Therefore, it is possible to further reduce leak current in standby operation without incurring the disadvantage of the layout.

Next description is made about a modification of the third embodiment. As described above, in the circuit configuration of the inverter circuit in the third embodiment, inverters have the alternate connections as illustrated in FIG. 7. Here, the modification of the third embodiment deals with a configuration where the sub-power supply voltage VCT and the sub-ground voltage VST are only supplied, instead of the alternate connections, as usage of the inverter circuit.

Figure 11:
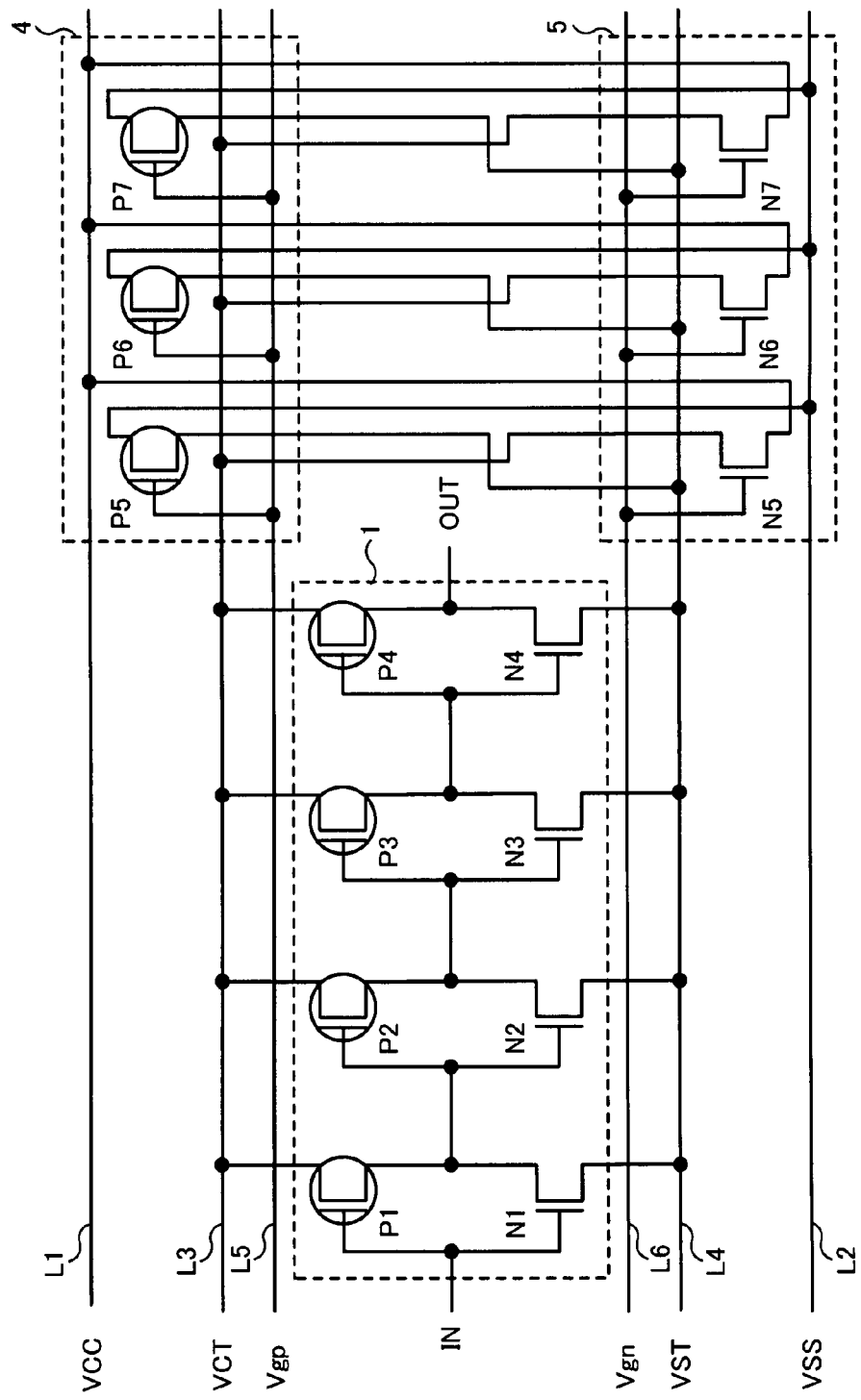
FIG. 11 is a view showing a circuit configuration corresponding to FIG. 7 regarding a modification of the third embodiment.
Figure 12:
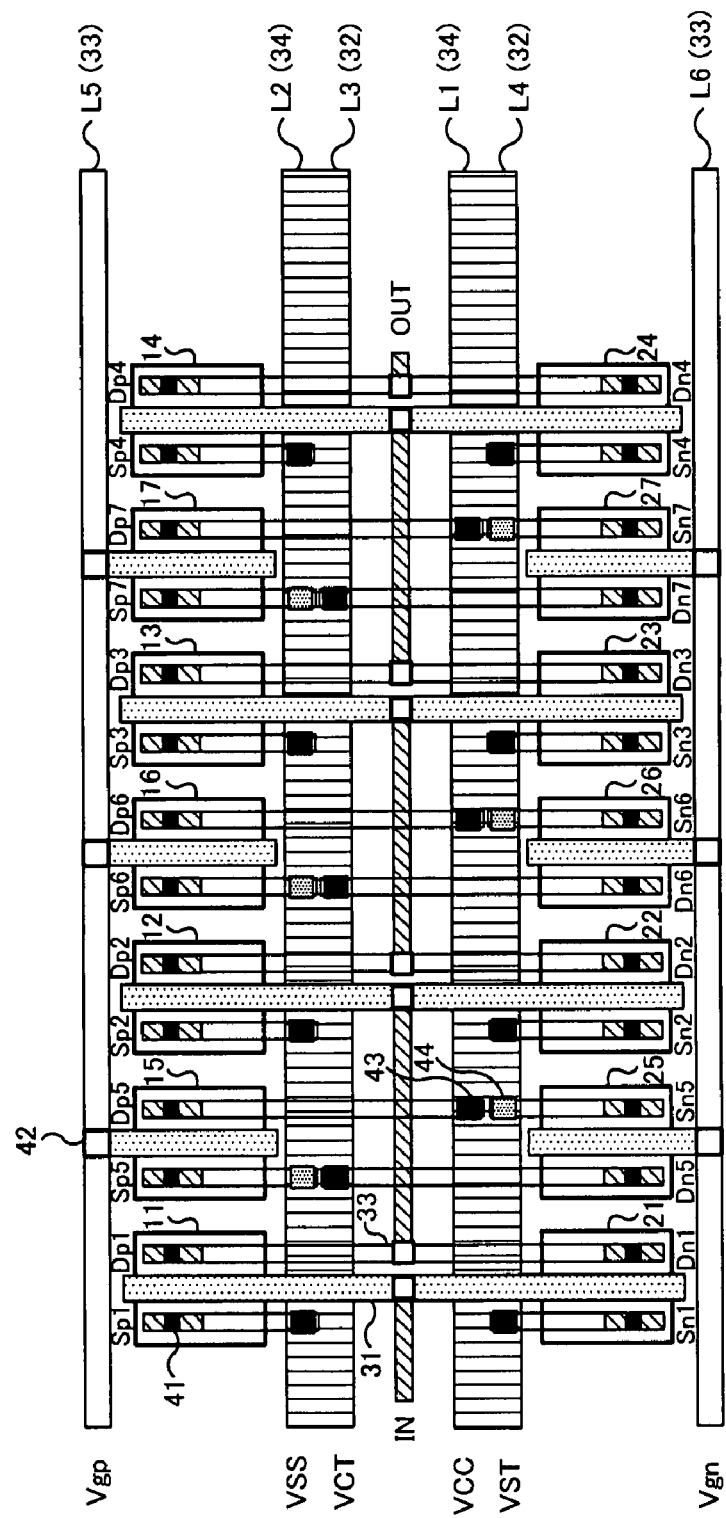
FIG. 12 is a view showing a layout corresponding to the circuit configuration of FIG. 11.

As to the modification of the third embodiment, FIG. 11 illustrates a circuit configuration corresponding to FIG. 7 and FIG. 12 illustrates a layout corresponding to FIG. 11. In the circuit configuration of FIG. 11, in a four-stage inverter unit 1, PMOS transistors P1 to P4 have sources all connected to the sub-power supply line L3 and NMOS transistors N1 to N4 have sources all connected to the sub-ground line L4. MOS transistors of the drivers 4 and 5 are connected in the same manner as those in FIG. 7.

In the layout of FIG. 12, the structure of the drivers 4 and 5 is identical to that in FIG. 8. However, a wiring structure of the inverter unit 1 is slightly different from that in FIG. 8. Specifically, the source lines Sp1 and Sp3 of the PMOS transistors P1 and P3, respectively, are connected to the nearer sub-power supply line L3 in the first wiring layer 32 via the connecting portions 43, and the source lines Sn2 and Sn4 of the NMOS transistors N2 and N4, respectively, are connected to the nearer sub-ground line L4 in the first wiring layer 32 via the connecting portions 43. Hence, only if the second wiring layer 33 and the connecting portions 43 and 44 are changed in position in the manufacturing process of the inverter circuit of the third embodiment, the configuration in which the sub-power supply voltage VCT and the sub-ground voltage VST are only supplied to the inverters can be easily obtained.

Fourth Embodiment

Figure 13:
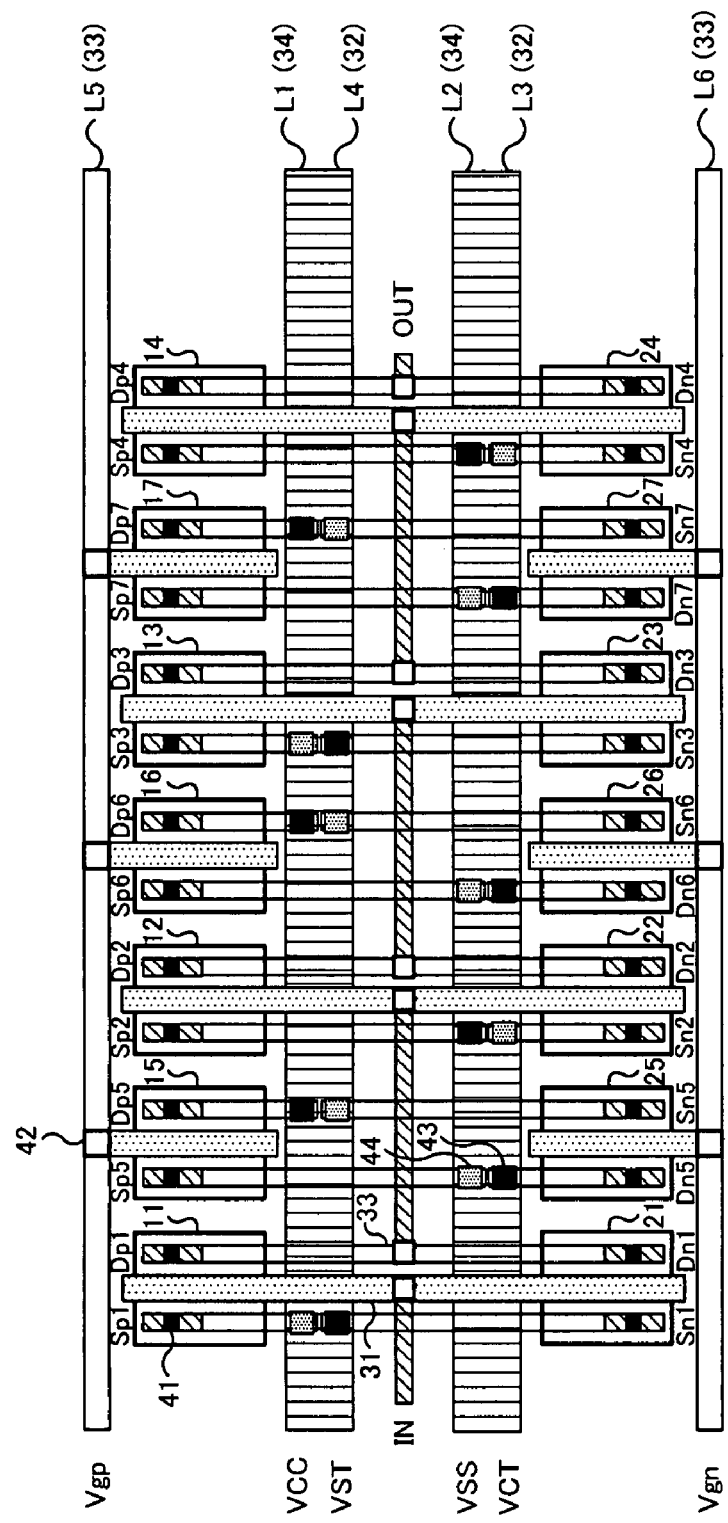
FIG. 13 is a view showing a circuit configuration of an inverter circuit of a fourth embodiment.

Next, the fourth embodiment deals with a case in which the circuit configuration of the inverter circuit of the third embodiment is realized in another layout. The inverter circuit of the fourth embodiment has the same circuit configuration as that in FIG. 7, but has a layout shown in FIG. 13. Here, cross-sectional structure corresponding to the layout of FIG. 13 is such that connecting portions 43 and 44 having the stacking directions illustrated in FIGS. 3A and 3B are arranged in accordance with each position of cross section.

In the layout of the fourth embodiment, as compared with the layout of the third embodiment, the first wiring layer 32 and the third wiring layer 34 are interchanged between the P-channel side and the N-channel side. In other words, at the P-channel side, the sub-ground line L4 formed in the first wiring layer 32 and the main power supply line L1 formed in the third wiring layer 34 are opposed to each other in the stacking direction, and at the N-channel side, the sub-power supply line L3 formed in the first wiring layer 32 and the main ground line L2 formed in the third wiring layer 34 are opposed to each other in the stacking direction.

Then, in order to match the above-described wiring configuration, the positions of the connecting portions 43 and 44 formed in downward and upward directions of the second wiring layer 33 connected to the inverter circuit 1 and the drivers 4 and 5 are interchanged between the P-channel side and the N-channel side.

Next description is made about a modification of the fourth embodiment. The circuit configuration of the inverter circuit in the fourth embodiment is such that inverters have alternate connections, like in the third embodiment (see FIG. 7). Although the above-described modification of the third embodiment is so configured that the sub-power supply voltage VCT and the sub-ground voltage VST are only supplied, the modification of the fourth embodiment is so configured that the main power supply voltage VCC and the main ground voltage VSS are only supplied.

Figure 14:
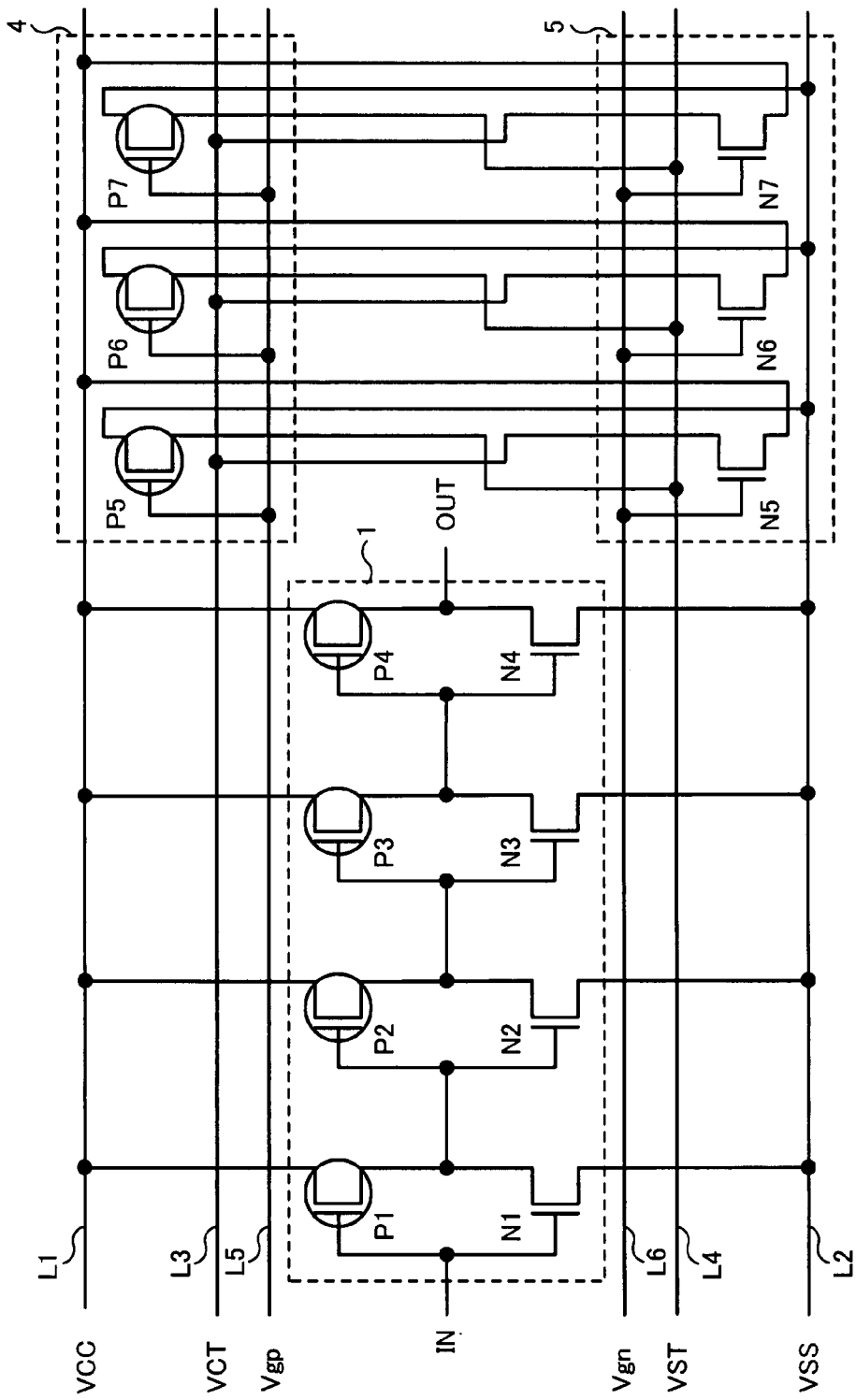
FIG. 14 is a view showing a circuit configuration corresponding to FIG. 7 regarding a modification of the fourth embodiment.
Figure 15:
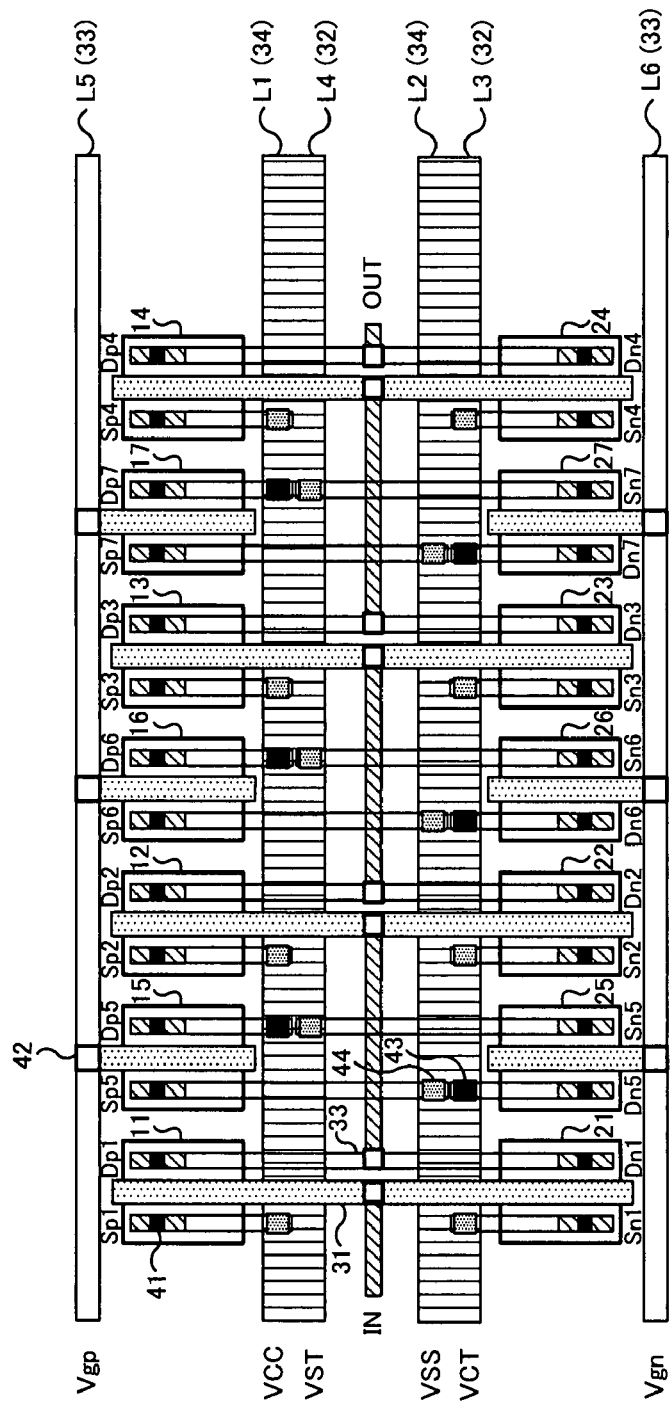
FIG. 15 is a view showing a layout corresponding to the circuit configuration of FIG. 14.
Figure 16A:
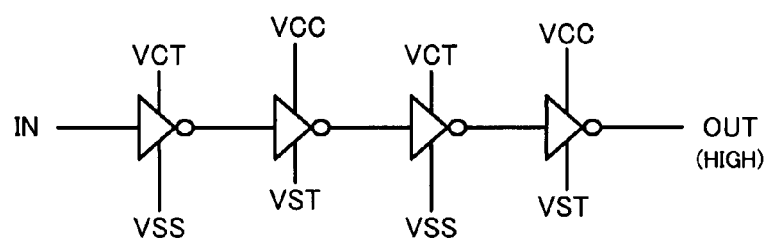
FIGS. 16A and 16B are views showing configurations of four-stage inverter circuits configured on a semiconductor device.
Figure 16B:
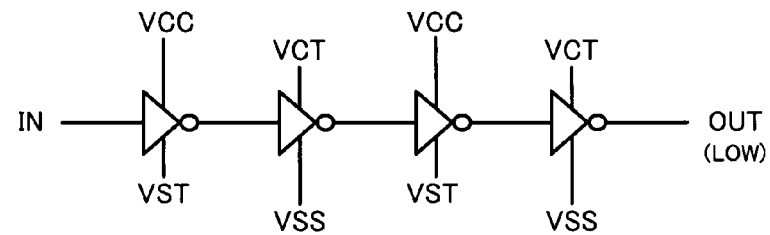

As to the modification of the fourth embodiment, FIG. 14 illustrates a circuit configuration corresponding to FIG. 7 and FIG. 15 illustrates a layout corresponding to FIG. 14. In the circuit configuration of FIG. 14, in a four-stage inverter unit 1, the PMOS transistors P1 to P4 have sources all connected to the main power supply line L1 and the NMOS transistors N1 to N4 have sources all connected to the main ground line L2. Here, MOS transistors of the drivers 4 and 5 are connected in the same manner as in FIGS. 7 and 11.

In the layout of FIG. 15, the structure of the drivers 4 and 5 is identical to that in FIG. 13. However, a wiring structure of the inverter unit 1 is slightly different from that in FIG. 13. Specifically, the source lines Sp2 and Sp4 of the PMOS transistors P2 and P4, respectively, are connected to the nearer main power supply line L1 in the third wiring layer 34 via the connecting portions 44, and the source lines Sn1 and Sn3 of the NMOS transistors N1 and N3, respectively, are connected to the nearer main ground line L2 in the third wiring layer 34 via the connecting portions 44. Hence, only if the second wiring layer 33 and the connecting portions 43 and 44 are changed in position in the manufacturing process of the inverter circuit of the third embodiment, the configuration in which the main power supply voltage VCC and the main ground voltage VSS are only supplied to the inverters can be easily obtained.

Up to this point, the present invention has been described specifically based on the first to fourth embodiments. However, the present invention is not limited to each of these embodiments, and can be carried into practice with various modifications without departing from the subject matter thereof. For example, in each of these embodiments, the case in which the present invention is applied to the inverter circuit of the semiconductor device has been described, but the present invention is not limited to the inverter circuit, and is widely applicable to semiconductor devices having various types of logic circuits to which the power supply voltage VCC, the ground voltage VSS, the sub-power supply voltage VCT, and the sub-ground voltage VST are supplied.

Further, in the first to fourth embodiments, the configuration in which the power supply voltage VCC, the sub-power supply voltage VCT, the ground voltage VSS and the sub-ground voltage VST are supplied to the logic circuit has been described, but the present invention is also applicable to a configuration in which a first voltage V1, a first sub-voltage Vs1, a second voltage V2 and a second sub-voltage Vs2 are supplied as a general power supply wiring system. In this case, the power supply wiring system has to be configured to satisfy the following relationship:

$$V1 > Vs1 > Vs2 > V2$$

The present invention is not limited to the above described embodiments, and various variations and modifications may be possible without departing from the scope of the present invention.

This application is based on the Japanese Patent application No. 2006-153690 filed on Jun. 1, 2006, entire content of which is expressly incorporated by reference herein.

What is claimed is:

1. A semiconductor device, comprising:
   a logic circuit to which a power supply voltage and a sub-power supply voltage lower than said power supply voltage are supplied at a power supply side and to which a ground voltage and a sub-ground voltage higher than said ground voltage are supplied at a ground side;
   a driver for generating said sub-power supply voltage based on said power supply voltage and for generating said sub-ground voltage based on said ground voltage;
   a first wiring layer including a sub-power supply line for supplying said sub-power supply voltage and a sub-ground line for supplying said sub-ground voltage;
   a second wiring layer including source/drain lines for PMOS and NMOS transistors included in said logic circuit and said driver;
   a third wiring layer including a main power supply line for supplying said power supply voltage and a main ground line for supplying said ground voltage and arranged opposite to said first wiring layer in a stacking direction to sandwich said second wiring layer;
   first via structures for connecting said source/drain lines of said second wiring layer to said sub-power supply line or said sub-ground line of said first wiring layer in said stacking direction; and
   second via structures for connecting said source/drain lines of said second wiring layer to said main power supply line or said main ground line of said third wiring layer in said stacking direction,
   wherein said logic circuit comprises an inverter circuit in which pairs of a PMOS transistor and an NMOS transistor are connected in a predetermined number of stages,
   wherein said driver comprises one or more PMOS transistors and one or more NMOS transistors, and an operation of each of the PMOS and NMOS transistors is controlled by a control voltage applied to each gate thereof,
   wherein the PMOS transistors included in said inverter circuit and the PMOS transistors included in said driver are alternately arranged with a predetermined spacing, and the NMOS transistors included in said inverter circuit and the NMOS transistors included in said driver are alternately arranged with a predetermined spacing.

2. A semiconductor device according to claim 1, wherein the PMOS transistors included in said inverter have sources of odd number stages connected to said main power supply line and sources of even number stages connected to said sub-power supply line, and the NMOS transistors included in said inverter have sources of odd number stages connected to said sub-ground line and sources of even number stages connected to said main ground line.

3. A semiconductor device according to claim 2, wherein said inverter circuit is controlled such that said output signal from an even number stage is low in a standby operation.

4. A semiconductor device according to claim 1, wherein the PMOS transistors included in said inverter have sources of odd number stages connected to said sub-power supply line and sources of even number stages connected to said main power supply line, and the NMOS transistors included in said inverter have sources of odd number stages connected to said main ground line and sources of even number stages connected to said sub-ground line.

5. A semiconductor device according to claim 4, wherein said inverter circuit is controlled such that said output signal from an even number stage is high in a standby operation.

6. A semiconductor device, comprising:
a first wiring layer wherein is formed a sub-power supply line and a sub-ground line;
a second wiring layer wherein is formed source/drain lines for a plurality of PMOS and NMOS transistors included in said semiconductor device;
a third wiring layer wherein is formed a main power supply line and a main ground line, said third wiring layer being arranged, at least in a portion including said main power supply line and said main ground line, to be opposite to said first wiring layer so as to overlay said first wiring layer in a stacking direction such that said second wiring layer is sandwiched between said first and third wiring layers;
first via structures interconnecting a first plurality of said source/drain lines to said sub-power supply line and a second plurality of said source/drain lines to said sub-ground line;
second via structures interconnecting a third plurality of said source/drain lines to said main power supply line and a fourth plurality of said source/drain lines to said main ground line;
a logic circuit, comprising one or more of said plurality of PMOS and NMOS transistors, to which a power supply voltage and a sub-power supply voltage lower than said power supply voltage are supplied at a power supply side and to which a ground voltage and a sub-ground voltage higher than said ground voltage are supplied at a ground side; and
a driver, comprising others of said plurality of PMOS and NMOS transistors, for generating said sub-power supply voltage based on said power supply voltage and for generating said sub-ground voltage based on said ground voltage, gates of said PMOS and NMOS transistors of said driver respectively controlling said sub-power supply voltage and said sub-ground voltage.

7. A method of distributing power in a semiconductor device, said method comprising:
forming, on a first wiring layer, a sub-power supply line and a sub-ground line;
forming, on a second wiring layer, source/drain lines for a plurality of PMOS and NMOS transistors included in said semiconductor device;
forming, on a third wiring layer, a main power supply line and a main ground line, said third wiring layer being arranged, at least in a portion including said main power supply line and said main ground line, to be opposite to said first wiring layer and to overlay said first wiring layer in a stacking direction such that said second wiring layer is sandwiched between said first and third wiring layers;
forming first via structures to interconnect a first plurality of said source/drain lines to said sub-power supply line and to interconnect a second plurality of said source/drain lines to said sub-ground line;
forming second via structures to interconnect a third plurality of said source/drain lines to said main power supply line and to interconnect a fourth plurality of said source/drain lines to said main ground line;
forming a logic circuit, comprising one or more of said plurality of PMOS and NMOS transistors, to which a power supply voltage and a sub-power supply voltage lower than said power supply voltage are supplied at a power supply side and to which a ground voltage and a sub-ground voltage higher than said ground voltage are supplied at a ground side; and
forming a driver, comprising others of said plurality of PMOS and NMOS transistors, for generating said sub-power supply voltage based on said power supply voltage and for generating said sub-ground voltage based on said ground voltage, gates of said PMOS and NMOS transistors of said driver respectively controlling said sub-power supply voltage and said sub-ground voltage.

* * * * *